United States Patent [19]

Kawanishi

[11] 4,399,542
[45] Aug. 16, 1983

[54] TRANSVERSE JUNCTION STRIPE LASER WITH DISTRIBUTED BRAGG REFLECTORS

[75] Inventor: Hideo Kawanishi, Machida, Japan

[73] Assignee: Honeywell Inc., Minneapolis, Minn.

[21] Appl. No.: 239,845

[22] Filed: Mar. 2, 1981

[51] Int. Cl.³ .............................................. H01S 3/19
[52] U.S. Cl. ..................................... 372/47; 357/17; 372/50
[58] Field of Search .................... 372/45, 47, 50, 96; 357/17

[56] References Cited

U.S. PATENT DOCUMENTS 4,334,311  6/1982  Oomura et al. ..................... 372/47

OTHER PUBLICATIONS

Kawanishi et al., "AlGaAs Transverse Junction Stripe Laser With Distributed Bragg Reflector", *Electronics Letters*, Sep. 1980, vol. 16, No. 19, pp 738-740.

Utaka et al., "Room-Temperature Operation of GaInAsP/InP Integrated Twin-Guide Lasers With First-Order Distributed Bragg Reflector", Conference: Integrated and Guided-Wave Optics Technical Digest Incline Village, Nv. USA 28-30 Jan. 1980, pp. MC5-1-4.

*Primary Examiner*—James W. Davie
*Attorney, Agent, or Firm*—Omund R. Dahle

[57] ABSTRACT

A solid state AlGaAs laser of the transverse junction stripe with distributed Bragg reflector type.

3 Claims, 3 Drawing Figures

TRANSVERSE JUNCTION STRIPE LASER WITH DISTRIBUTED BRAGG REFLECTORS

BACKGROUND AND SUMMARY OF THE INVENTION

The present invention is directed to the field of AlGaAs stripe geometry lasers and more particularly to AlGaAs transverse junction stripe laser with distributed Bragg reflectors. In the background art there have been distributed Bragg reflector lasers using large optical cavity and integrated twin guide structures. In the present invention the fabrication of a longitudinal mode stabilized AlGaAs transverse junction stripe (TJS) laser with distributed Bragg reflector (DBR) is described. This laser is capable of stable longitudinal mode operation and the required crystal can be grown in a single growth sequence. The transverse junction stripe laser is a special case of a laser with a heavily doped acive region. In the heavily doped active region, the energy band gap of the active region becomes slightly smaller than the non-doped region, these two regions being made in the same epitaxial layer of GaAs or AlGaAs. Using this dependence of energy gap on the doping level, enables the non-doped region to be used as a low-loss optical waveguide for the laser light lased in the heavily doped active region and the DBR is attached on the non-doped region.

The transverse junction stripe laser with distributed Bragg reflectors (TJS-DBR) has several advantages in that (a) it provides a high coupling efficiency, (b) because of the planar structure it is relatively easy to fabricate, (c) it provides a single wavelength operation and the wavelength is controllable, (d) there is stability of the lasing characteristics, and (e) it is compatible with integrated optics.

DESCRIPTION

Figure 1:
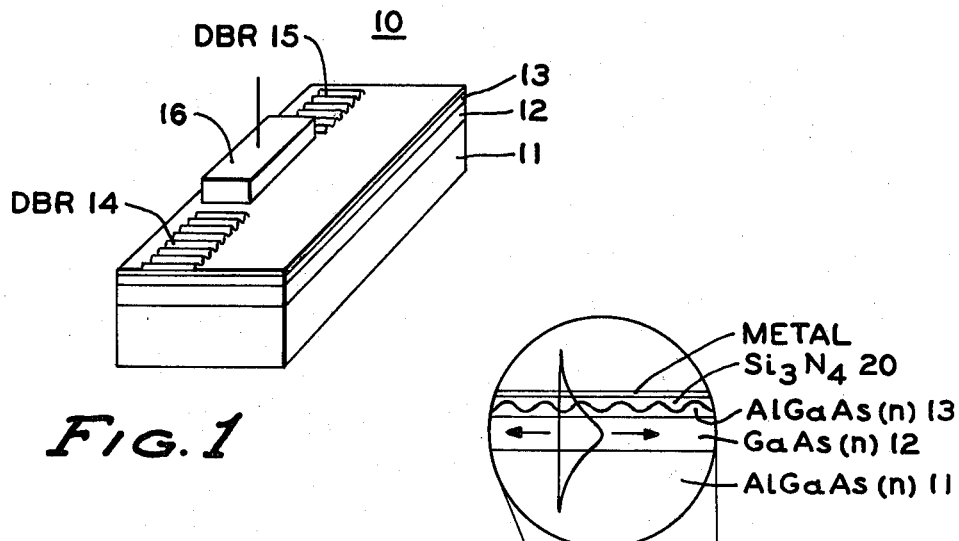
FIG. 1 is a general diagrammatic representation of the structure of the laser according to the invention.
Figure 2:
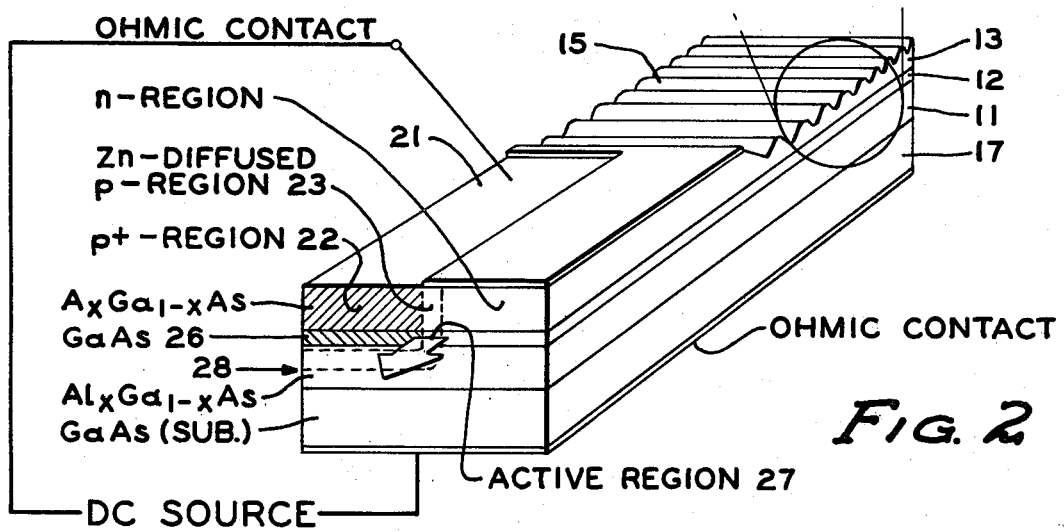
FIGS. 2 and 3 are more detailed view of the structure or portions of the structure of FIG. 1.

Referring now to FIG. 1 there is generally shown an AlGaAs transverse junction strip laser with distributed Bragg reflector (TJS-DBR) 10 which includes a wafer of 3 layers 11, 12 and 13 comprising an n layer of $Al_xGa_{1-x}As$ 11, an n layer of GaAs 12, and an n layer of $Al_xGa_{1-x}As$ 13. Two distributed Bragg reflectors 14 and 15 separated by active region 16 are etched on the surface of the laser. FIG. 2 shows the TJS-DBR in more detail. The laser is fabricated on a substrate 17 of GaAs (oriented <100>) which provided support to the epitaxial wafer layers 11, 12 and 13. In one preferred embodiment the $Al_xGa_{1-x}As$ layers 11 and 13 are $Al_{0.35}Ga_{0.65}As$ and the n-GaAs layer 12 was Te-doped to a carrier concentration of approximately $2 \times 10^{18}$ cm$^{-3}$. A film 20 of $Si_3N_4$ is sputtered onto the surface.

At the location 21 there is etched an opening in the film 20 to allow a diffusion of Zn. A semiclosed ampoule was used for the two-step Zn diffusion in order to make the required p+,p,n region. The Zn diffusion results in a p+ region 22 in the layer 13 of $Al_xGa_{1-x}As$ with a p region 23 next to it. Beneath the p+ region 22 and the p region 23 is a thin layer p region 26 of GaAs, the remainder of the thin active layer being n-GaAs in the layer 12. An ohmic contact beneath the substrate layer and an ohmic contact at the top surface provide for the energization of the device from a DC source. The injection is from the n GaAs layer 12 into the Zn diffused p GaAs in FIG. 2, the active region being designated 27. FIG. 2 indicates the location and shape of the P-N junction 28 due to the Zn diffusion.

In the Zn diffusion process, $ZnAs_2$ was used as the diffusion source and the first diffusion was performed at about 700° C. To form the p region the device was subsequently annealed at about 900° C.

Figure 3:
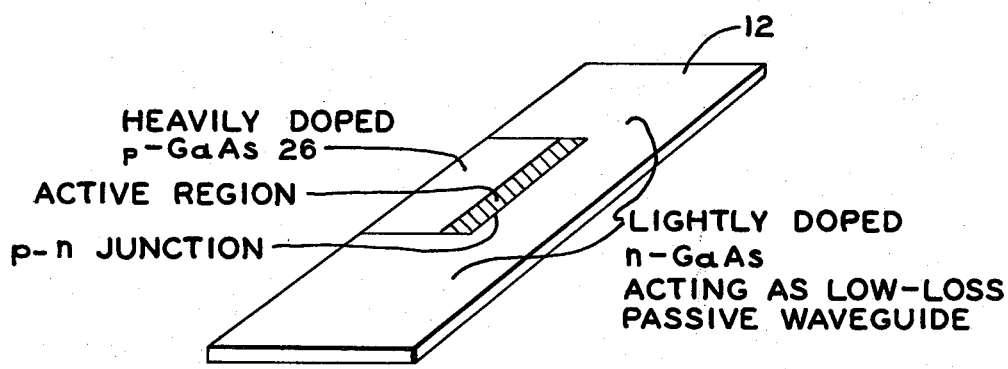

In operation, when current is injected through the p contact, the current flows laterally across the p,n junction in the GaAs layer and electron-hole recombination occurs primarily in the heavily doped p region of the GaAs layer. See FIG. 3 which discloses the GaAs layer. Because the energy bandgap of the lightly doped n GaAs region is slightly wider than that of the heavily doped p GaAs active region, the low doped n GaAs layer acts as a low-loss optical passive waveguide for laser light emitted in the heavily doped p region.

In one specific embodiment of the TJS:DBR, substantially like the embodiment of FIG. 2, the distributed Bragg reflector 15 was made to a length of about 220 um and the pumping region was about 150 um long. The near end of the laser was cleaved to provide a facet through which the lasing light output was measured. The DBR mode lasing wavelength, which was slightly temperature dependent, was about 8010 A° at 133 K. The temperature dependence of the DBR mode wavelength was $d\lambda/dT = 0.5$ A°/°C. at low temperature.

The embodiments of the invention in which an exclusive property or right is claimed are defined as follows:

1. A transverse junction stripe (TJS) laser having thereon a distributed Bragg reflector including a layer of GaAs comprising a heavily doped p-GaAs active region and a lightly doped n-GaAs region which acts as a low loss optical passive waveguide for laser light emitted in the heavily doped p-region, wherein the layer of GaAs is sandwiched between layers of $Al_xGa_{1-x}As$, and wherein the sandwiched layers are elongated and the heavily doped p-GaAs active region is located intermediate a lightly doped n-GaAs region on either end and wherein two distributed Bragg reflectors are etched on the surface of the $Al_xGa_{1-x}As$ layer in the proximity of the light doped n-GaAs regions, and a pair of ohmic contacts thereon to provide for energization of the TJS laser.

2. A trasverse junction stripe (TJS) laser having thereon a distributed Bragg reflector including a layer of GaAs comprising a heavily doped p-GaAs active region and a lightly doped n-GaAs region which acts as a low loss optical passive waveguide for laser light emitted in the heavily doped p-region, wherein the layer of GaAs is sandwiched between layers of $Al_xGa_{1-x}As$, and wherein the sandwiched layers are elongated with the heavily doped p-GaAs active region being spaced from the lightly doped n-GaAs region, wherein a distributed Bragg reflector is etched on the surface of the $Al_xGa_{1-x}As$ layer in the proximity of the lightly doped n-GaAs region, and wherein the sandwiched layers are cleaved at the location of the active region to provide a facet through which lasing light may output, and a pair of ohmic contacts thereon to provide for energization of the TJS laser.

3. A transverse junction stripe laser with distributed Bragg reflector comprising:
a substrate of single crystal n-GaAs;

a first layer of n-$Al_xGa_{1-x}As$ epitaxially grown on said substrate;

a second layer of n-GaAs epitaxially grown on said first layer;

a third layer of n-$Al_xGa_{1-x}As$ epitaxially grown on said second layer and having a surface;

a portion of the surface area of said third layer etched to form at the surface of said third layer a distributed Bragg reflector;

an insulating layer sputtered onto said third layer surface; and,

A Zn diffused area extending downward from a window in said insulating layer through a portion of said third layer, said second layer and into said first layer thereby making a vertical p+, p, n region; and, two ohmic contacts one to the top p-$Al_xGa_{1-x}As$ layer and one to the bottom n-GaAs layer.

* * * * *